United States Patent [19]

Oshidari et al.

[11] Patent Number: 5,896,449
[45] Date of Patent: Apr. 20, 1999

[54] VOICE ENHANCEMENT SYSTEM AND METHOD

[75] Inventors: Thomas T. Oshidari, San Jose, Calif.; Allen Y. Tong, Plano, Tex.

[73] Assignee: Alcatel USA Sourcing L.P., Plano, Tex.

[21] Appl. No.: 08/719,805

[22] Filed: Sep. 25, 1996

Related U.S. Application Data

[63] Continuation-in-part of application No. 08/484,677, Jun. 7, 1995, Pat. No. 5,592,545, which is a continuation of application No. 08/161,120, Dec. 2, 1993, Pat. No. 5,471,527.
[60] Provisional application No. 60/009,544, Dec. 29, 1995.

[51] Int. Cl.⁶ .......................... H04M 1/00; H04M 9/00
[52] U.S. Cl. .................. 379/347; 379/406; 379/414; 379/400; 704/201
[58] Field of Search .......................... 381/106, 107, 381/108; 379/347, 406, 414, 400

[56] References Cited

U.S. PATENT DOCUMENTS

| | | | |
|---|---|---|---|
| 3,941,948 | 3/1976 | Brooks | 179/170 R |
| 4,461,025 | 7/1984 | Franklin | 381/107 |
| 5,007,044 | 4/1991 | Miyoshi et al. | 370/32.1 |
| 5,195,132 | 3/1993 | Bowker et al. | 379/410 |
| 5,280,473 | 1/1994 | Rushing et al. | 370/32.1 |
| 5,280,525 | 1/1994 | Wesel | 379/400 |
| 5,317,596 | 5/1994 | Ho et al. | 375/14 |
| 5,351,031 | 9/1994 | Henderson | 340/146.2 |
| 5,351,291 | 9/1994 | Menez et al. | 379/410 |
| 5,388,185 | 2/1995 | Terry et al. | 395/2.14 |
| 5,471,527 | 11/1995 | Ho et al. | 379/347 |

FOREIGN PATENT DOCUMENTS

| | | | |
|---|---|---|---|
| 0539017 | 9/1992 | European Pat. Off. | H04M 3/40 |
| 9515643 | 6/1995 | WIPO . | |

OTHER PUBLICATIONS

PCT Search Report, PCT/US/96/20114, Jul. 25, 1997.

*Primary Examiner*—Daniel S. Hunter
*Attorney, Agent, or Firm*—Baker & Botts, L.L.P.

[57] ABSTRACT

A system (130) for providing enhancement to a voice-band signal in a telecommunications network (138) is provided. The present system (130) includes a power averager (18) for determining the average power of the voice-band signal. The present system (130) also includes an equalizer (132) for attenuating a predetermined portion of the voice-band signal and an output scaler (134) for scaling the equalized voice-band signal with a scaling factor. The system (130) of the present invention also includes an automatic gain enhancer (136) for applying an automatic gain factor to the scaled voice-band signal and wherein the automatic gain factor is dependent upon the average power of the input voice-band signal.

22 Claims, 5 Drawing Sheets

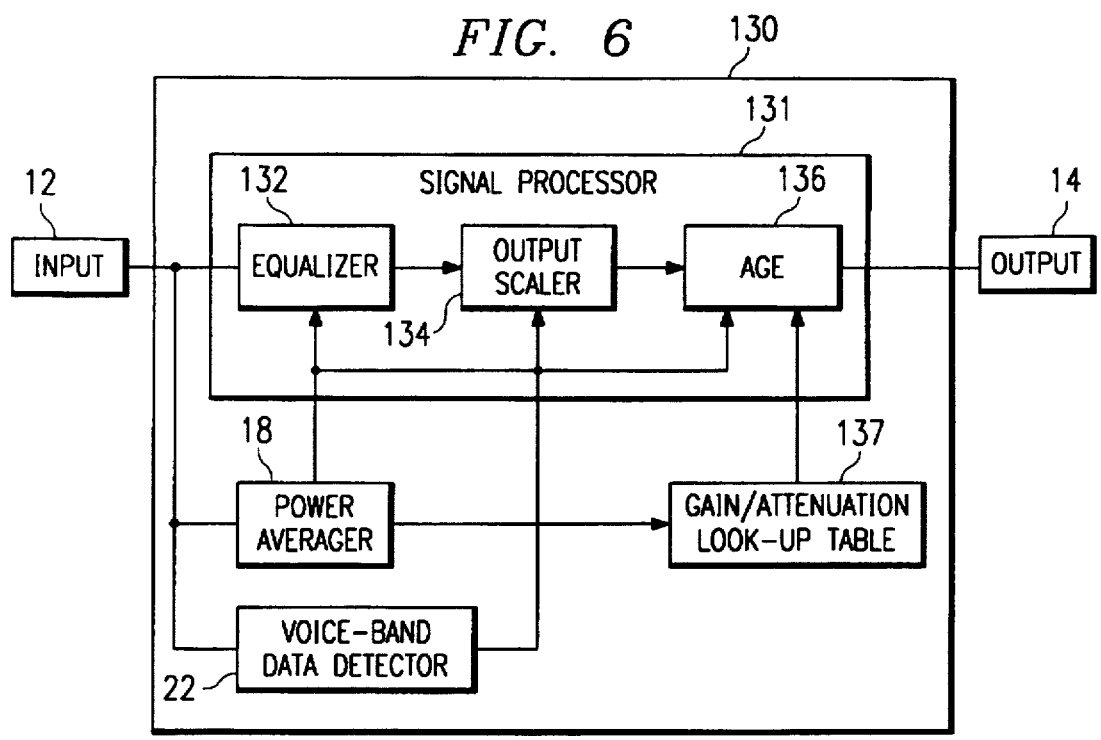
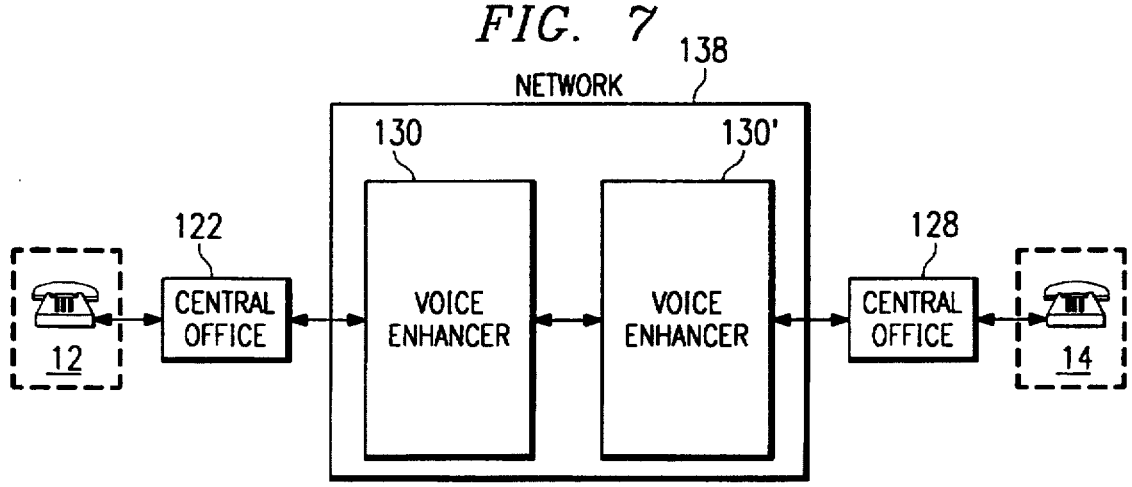

VOICE ENHANCEMENT SYSTEM AND METHOD

CROSS-REFERENCE TO RELATED APPLICATIONS

This application is a continuation-in-part of prior U.S. application Ser. No. 08/484,677 (Attorney Docket No. 036560.1531), entitled *Voice Enhancement System and Method*, filed Jun. 7, 1995, now U.S. Pat. No. 5,572,545, which is a continuation of U.S. application Ser. No. 08/161,120 (Attorney Docket No. 036560.0748) entitled *Voice Enhancement System and Method*, filed Dec. 2, 1993, now U.S. Pat. No. 5,471,527.

This application claims the benefit of U.S. Provisional Application Ser. No. 60/009,544, filed on Dec. 29, 1995.

TECHNICAL FIELD OF THE INVENTION

This invention relates in general to the field of voice signal processing in a telecommunications network, and more particularly to an improved method and apparatus for enhancing the quality of voice signals in a telecommunications network.

BACKGROUND OF THE INVENTION

Modern telecommunications networks are comprised of input and output devices, e.g., telephone sets, local central offices, and one or more telephone switches that are used for processing voice signals in the network. Voice signals can be characterized as containing two regions, including the bass region and the treble region. The bass region is typically considered to be that part of the voice signal below 300 hertz (Hz), and the treble portion is that part of the signal above 300 Hz. Voice signals may be attenuated in the bass band region by one or more of the elements in a telecommunication network.

The Electronic Industry Association (EIA) standard RS-470, published January 1981, recommends that the input voice signal be attenuated below approximately 300 Hz by the codec in the input telephone station. This attenuation of the amplitude of the bass portion of the input voice signal is recommended because background noises in a telecommunication network lie in the bass region. By decreasing the amplitude of the bass portion of the input signal, the background noises of the network are also diminished.

Additionally, central offices of a telecommunication network may also attenuate the bass band region of a voice signal. Within a central office may be located a channel bank that converts the analog input voice signal to its digital equivalent. The digital voice signal is coupled to the receiving telephone set by a digital telephone switch or switches. Before the signal is provided to the receiving telephone set, it is converted back to analog format at another central office located between the last switch and the receiving telephone set. The channel banks may attenuate the bass portion of the input voice signal during the analog to digital conversion process.

Some networks, therefore, attenuate the bass region of the input voice signal twice; in the input telephone set and in the central office. Attenuation of the bass region of the input signal results in a voice signal at the receiving telephone set that is not a true representation of the speaker's voice. Techniques have thus been proposed to compensate for the loss of bass in a telephone speaker's voice.

One prior approach for providing an enhanced voice signal in a telecommunications network utilizes a fixed gain technique. In the fixed gain approach, the bass portion of the voice signal is amplified while the signal is in the telecommunications network and before it is supplied to the receiving telephone set. This approach compensates for attenuation of the input signal with a fixed gain at some point within the network. This approach also amplifies the previously noted network background noises within the bass band region.

Moreover, if the input voice signal is a loud signal, i.e., the speaker is speaking at a high decibel (dB) level, the fixed gain enhancement approach will further amplify the high decibel signal, thus resulting in a signal at the receiving telephone set that can be uncomfortable to listen to. Alternatively, applying a fixed gain to a high decibel input signal can result in over-driving/saturating different network elements, making the signal less clear than it would have been if the fixed gain had not been applied.

An additional problem associated with the fixed gain technique for voice enhancement occurs when data is transmitted over the telecommunications network in the voice-band. This is becoming a more frequent occurrence for telecommunications systems as the use of facsimile machines and modems coupling computers continues to grow. A modem or facsimile machine transmits voice-band data at a high amplitude and at a high-frequency, e.g., 2700 Hz. Therefore, should the fixed gain technique be applied to a voice-band data signal, it will be unnecessarily amplified, thus resulting in a voice-band data signal that is difficult to use on the receiving end.

Detectors for sensing the transmission of voice-band data have been employed to solve the problems associated with voice-band data transmissions. These detectors are remote to the fixed gain enhancement circuitry, requiring an external control link to the enhancement circuitry for disabling the circuitry. This ensures that the voice-band data is not amplified.

Another problem associated with previously developed voice enhancement systems occurs when an input voice signal traveling in a telecommunications network encounters or must pass through multiple network elements (tandem network) that include fixed gain voice enhancement circuitry. Current fixed gain voice enhancement systems cannot detect when a input voice signal has already been adjusted by the fixed gain technique. Therefore, a voice signal amplified in a first element of a tandem network may be subsequently again amplified by the second element in the network. This additional amplification can result in the saturation of the voice signal, or at a minimum, make the signal uncomfortable to listen to on the receiving telephone set. Also, multiple enhancements to a voice signal can result in oscillation of the voice signal in the tandem network.

One prior approach for detecting whether a signal has been previously enhanced (tandem detection) involves the generation and detection of a sub-audible tone, typically on the order of 20 Hz as an indication of whether the voice signal has been enhanced. Such a tone passes freely over the central digital network where normally there is no frequency selective filtering. When the voice signal with the sub-audible tone goes off the digital network, however, and is converted to analog before being delivered to the subscriber, the tone is stripped off by a codec and transformer filtering. It is then possible for the subscriber to create the tandemed situation by conferencing back onto the network without the sub-audible tone passing between the tandemed networks. Without the sub-audible tone, this previously enhanced signal may be enhanced an additional time in the network, which may result in an unsatisfactory signal as previously described.

SUMMARY OF THE INVENTION

Therefore, a need has arisen for a voice enhancement system which eliminates the problems associated with prior voice enhancement systems.

A need exists for a voice enhancement system which does not amplify the background noise of the telecommunications network during periods of silence on the network.

A need further exists for a voice enhancement system that does not amplify higher level voice signals.

An additional need exists for a voice enhancement system that will not over-drive or saturate higher level voice signals.

A need exists further for a voice enhancement system that detects the transmission of voice-band data without requiring a separate external detector.

A further need exists for a voice enhancement system that works effectively in a tandem network.

An additional need exists for a voice enhancement system that does not cause oscillation of the voice signal.

Yet a further need exists for detecting whether a voice signal has been previously enhanced that does not rely on the absence or presence of a sub-audible tone.

Therefore, one aspect of the present voice enhancement system prevents the amplification of background noise during periods of silence on the network call.

Another aspect of the present system adaptively changes the amplification of the voice signal so that voice signals of sufficient strength are not amplified.

An additional aspect of the present system ensures that high level voice signals are not over-driven or saturated.

Another aspect of the present invention is that it internally detects the transmission of voice-band data and disables signal enhancement appropriately.

An additional aspect of the voice enhancement system of the present invention is that it can successfully be employed in a tandem network.

Another aspect of the present system is that it minimizes opportunity for causing oscillation of the voice signal.

Yet another aspect of the present invention provides a system and method for detecting whether a voice signal has been previously enhanced that does not rely on the absence or presence of a sub-audible tone.

In accordance with the present invention, a voice enhancement system is provided that substantially eliminates or reduces disadvantages and problems associated with prior fixed gain enhancement systems.

A system including the adaptive gain control voice enhancer of the present invention includes an input for accepting voice signals and an output for receiving voice signals with a coupling between the input and output. The coupling includes a voice enhancer which contains a power averager for determining the average power of the voice signal. The voice enhancer also includes an equalizer for attenuating a predetermined portion of the voice signal and an output scaler for scaling the equalized voice signal in response to the determined average power and providing the scaled signal to the output.

Specifically, the voice enhancer of the present invention includes a voice-band data detector and a tandem voice enhancement detector, either of which can disable the voice enhancer appropriately.

A method for providing adaptive gain control with the voice enhancer of the present invention includes determining the average power of an input voice signal, and determining a scaling factor in response to the average power of the input signal. The present inventive method also includes equalizing the input voice signal by attenuating a predetermined portion of the input voice signal. The present method includes scaling the equalized input signal with the determined scaling factor and coupling the scaled voice signal to an output.

More specifically, the present method for providing adaptive gain control voice enhancement includes decoupling the scaled voice signal from the output upon detecting voice-band data or tandem enhancement.

One aspect of the present invention provides a method for providing voice enhancement in a telecommunications network. The method includes determining the average power of an input voice-band signal and determining an automatic gain factor in response to the average power of the input voice-band signal. The present method further includes equalizing the input voice-band signal by attenuating a predetermined portion of the input voice-band signal and scaling the equalized voice-band signal with a scaling factor. The present method further includes applying the automatic gain factor to the scaled voice-band signal.

Moreover, another aspect of the present invention includes providing gain to voice-band signals having an average power above a predetermined minimum average power level but below a first predetermined power level, providing no change to voice-band signals having an average power above the first predetermined power level and below a second predetermined power level where the second predetermined power level is greater than the first predetermined power level, and attenuating voice-band signals having an average power level above the second predetermined power level.

Yet another aspect of the present invention provides a method for providing enhancement to a voice-band signal in a telecommunications network. The present method includes determining the average power of an input voice-band signal and determining an automatic gain factor in response to the average power of the input voice-band signal. This method further includes equalizing the input voice-band signal by attenuating a predetermined portion of the input voice-band signal and scaling the equalized voice-band signal with a scaling factor. The present invention also includes applying the automatic gain factor to the scaled voice-band signal by providing gain to voice-band signals having an average power above a predetermined minimum average power level but below a first predetermined power level, providing no change to voice-band signals having an average power above the first predetermined power level and below a second predetermined power level where the second predetermined power level is greater than the first predetermined power level, and attenuating voice-band signals having an average power level above the second predetermined power level.

An additional aspect of the present invention provides a system for providing enhancement to a voice-band signal in a telecommunications network comprising. The present system includes a power averager for determining the average power of the voice-band signal. The present system also includes an equalizer for attenuating a predetermined portion of the voice-band signal and an output scaler for scaling the equalized voice-band signal with a scaling factor. The system of the present invention also includes an automatic gain enhancer for applying an automatic gain factor to the scaled voice-band signal and wherein the automatic gain factor is dependent upon the average power of the input voice-band signal.

Moreover, the automatic gain enhancer of the present invention further provides gain to voice-band signals having an average power above a predetermined minimum average power level but below a first predetermined power level, no gain or attenuation to voice-band signals having an average power above the first predetermined power level and below a second predetermined power level where the second predetermined power level is greater than the first predetermined power level, and attenuates voice-band signals having an average power level above the second predetermined power level.

A technical advantage of the adaptive gain control (AGC) voice enhancement system of the present invention is that it provides an enhanced voice signal which sounds more like the speaker's voice. The present adaptive gain control voice enhancement system is compatible with either voice signals or voice-band data signals being transmitted in a telecommunications network.

The present voice enhancement system also provides a technical advantage of eliminating problems associated with currently available fixed gain control voice enhancement systems. The adaptive gain control of the present system attenuates high level input voice signals and amplifies low level input voice signals. The present invention will, therefore, not saturate an input voice signal that is initially at a high level.

An additional technical advantage of the present adaptive gain control voice enhancement system is that it will not amplify periods of silence in a ongoing conversation between remote telephone sets. Therefore, the present system will not amplify network background noise when voice signals are not being transmitted.

Another technical advantage of the present invention is that it is capable of detecting in a tandem network a voice signal which has been previously enhanced. Upon detecting a tandem configuration, the present system disables itself so that a previously enhanced signal is not again amplified. This provides a technical advantage of preventing an oscillation condition of a signal in the network.

Yet another technical advantage of the present system is that it is capable of detecting the transmission of voice-band data and disabling the adaptive gain of the signal as required. The present invention is also self-disabling upon detection of a tandem network or voice-band data and does not require an external control link or detector.

An additional technical advantage of the present invention is that it can be implemented in existing telecommunications equipment, for example in the echo canceler of a network, the present system is also compatible with existing telecommunication networks.

Yet another technical advantage of the present invention is that it detects whether a voice signal has been previously enhanced and prevents over enhancement of the signal without requiring a sub-audible tone in the signal.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein:

FIG. 6 shows a block diagram of an alternate embodiment for the voice enhancement system of the present invention;

FIG. 7 is a block diagram of a telecommunications network incorporating the voice enhancement system of the present invention;

DETAILED DESCRIPTION OF THE INVENTION

Embodiments of the present invention are illustrated in the FIGURES, like numerals being used to refer to like and corresponding parts of the various drawings.

Figure 1:
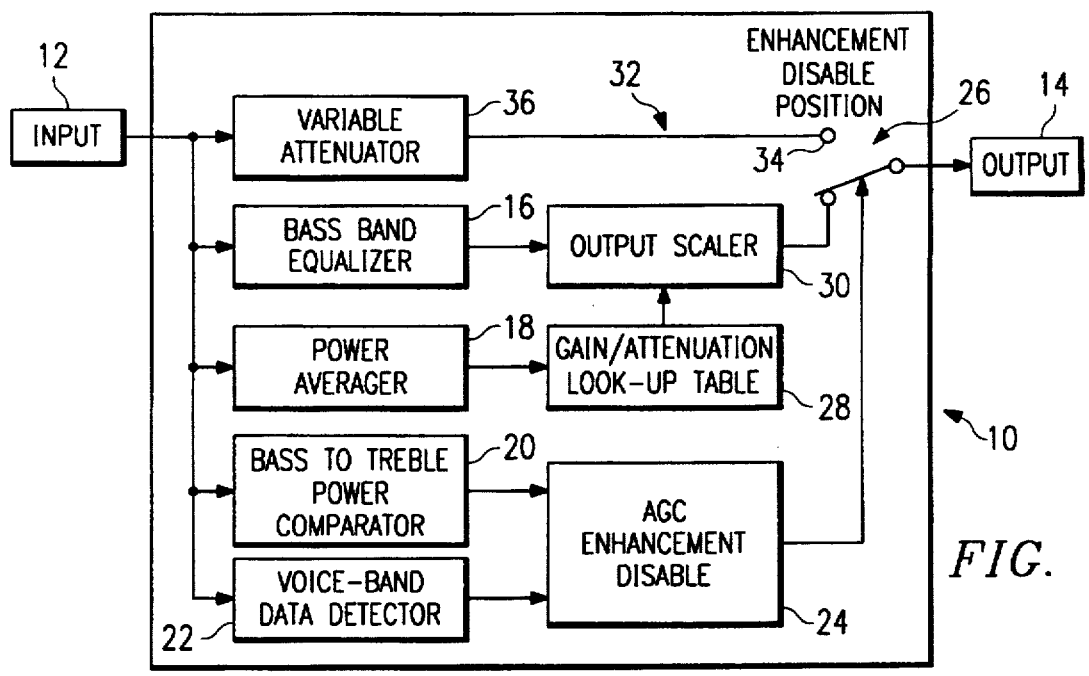
FIG. 1 illustrates a block diagram of the adaptive gain control circuitry of the voice enhancement system of the present invention.

FIG. 1 illustrates a block diagram for implementing the adaptive gain control (AGC) voice enhancement system of the present invention. Voice enhancer 10 of the present invention is coupled to an input 12 and an output 14. Input 12 is typically any device that would provide an input voice signal from a telephone set. Output 14, likewise includes any device used to produce an output voice signal to a telephone set.

Input 12 is coupled in parallel to a bass band equalizer 16, power averager 18, bass to treble power comparator 20, and voice-band data detector 22 on the input side of voice enhancer 10. Bass band equalizer 16 (or equalizer) equalizes an input voice signal by attenuating the amplitude of the treble portion of the input signal. Bass band equalizer 16 can be embodied in a digital filter that decreases the amplitude of the treble portion of an input voice signal. A typical demarcation between the bass and treble regions of the input voice signal is approximately 300 Hz, though other demarcations are possible without deviating from the inventive concepts of the present invention. Bass band equalizer 16 essentially equalizes the bass band distortion of the input signal introduced by an input telephone set or from analog to digital conversion of the signal in the channel bank of a central office.

Power averager 18 of voice enhancer 10 measures the average power of an input signal. This is accomplished with a variety of methods, and one embodiment of power averager 18 is a low pass filter through which the rectified input signal from input 12 is passed.

Also included in the input side of voice enhancer 10 is a tandem voice enhancement detector or bass to treble power comparator 20. Bass to treble power comparator 20 detects potential tandem enhancement of an input signal within a telecommunications network. Bass to treble power comparator 20 continually monitors the ratio of bass to treble power of the input signal. It is known that for an average input signal, the bass to treble power ratio is generally within a predetermined range. It is also known that the input telephone set and channel bank of a central office in a network attenuate the bass signal, thereby decreasing this ratio. Bass to treble power comparator 20 continuously monitors this ratio in the input signal. If the monitored bass to treble power ratio is much lower than expected for an enhanced signal, then bass to treble power comparator 20 discerns that no tandem enhancement circuit is present. Conversely, if the monitored power ratio is comparable or higher than expected, then bass to treble power comparator 20 discerns that a tandem voice enhancement circuit is present. Bass to treble power comparator 20 provides a technical advantage of detecting when an input voice signal has been previously enhanced so that voice enhancer 10 can be used in tandem networks.

Voice-band data detector 22 also analyzes the input signal. Voice-band data detector 22 determines whether the input voice signal is voice-band data. Voice-band data detection methods are well known in the art and will not be elaborated here. Voice enhancer 10 incorporates one of the prior art methods of detection so that the adaptive gain control of the input signal can be disabled when voice-band data is detected. Voice-band data detector 22 provides a technical advantage of detecting the transmission of voice-band data internally to voice enhancer 10 without requiring external control links and detectors.

Coupled to bass to treble power comparator 20 and voice-band data detector 22 is AGC enhancement disable 24. Based on the inputs of bass to treble power comparator 20 and voice-band data detector 22, AGC enhancement disable 24 determines whether voice enhancer 10 should be disabled by switch 26. The default position of switch 26 enables voice enhancement of the input signal, and will be disabled when AGC enhancement disable 24 determines that either the input signal has been previously enhanced or that the input signal is voice-band data.

Gain/attenuation look-up table 28 is coupled to power averager 18. Once the average power of an input signal is determined at power averager 18, a signal representative of the average power of the input signal is sent to gain/attenuation look-up table 28. Gain/attenuation look-up table 28 contains scaling factors that are applied to the input voice signal within the inventive concepts of the present invention. Gain/attenuation look-up table 28 is organized such that if the average power of the input signal is high, then the corresponding scaling factor is low. This provides a technical advantage of preventing the over-amplification of high level signals and prevents over-driving or saturating the signal.

The scaling factor can be less than unity if the average power of the input signal is sufficiently high. If the average power of the input signal is measured to be low, then the corresponding scaling factor is high. A typical input signal at average input power would have a corresponding scaling factor that provides minimal gain or attenuation of the signal, thereby ensuring that all signals receive AGC. Adaptively changing the scaling factor provides a technical advantage of preventing oscillation of the voice signal.

Output scaler 30 is coupled to gain/attenuation look-up table 28. Output scaler 30 is also coupled to bass band equalizer 16 that provides the equalized input signal to output scaler 30. Output scaler 30 applies the previously determined scaling factor from gain/attenuation look-up table 28 to accordingly amplify or attenuate the equalized input signal. Output scaler 30 provides the amplified signal to output 14.

Also shown in FIG. 1 is transparent path 32. Transparent path 32 is coupled to input 12 and enhancement disable position 34 of switch 26. Variable attenuator 36 is located between the ends of transparent path 32. Variable attenuator 36 can be included in voice enhancer 10 to provide enhanced noise suppression when voice enhancer 10 detects silence at input 12. When silence is detected, switch 26 is placed at enhancement disable position 34, and the path between input 12 and output 14 is by transparent path 32.

Upon switching to transparent path 32, variable attenuator 36 is set for minimum attenuation. Over a period of time each signal below the voice threshold causes the attenuation in variable attenuator 36 to increase (for example, 0.5 decibels per 3 milliseconds) toward a maximum value for variable attenuator 36. Increasing the attenuation of variable attenuator 36 causes the background noises of the network to be suppressed. This provides the technical advantage of minimizing the level of background noises during periods of silence.

As the level of the input signals increase, the attenuation of variable attenuator 36 decreases towards minimum attenuation. After a short period of integration (for example, 3 samples of the input signal) of input signals above the predetermined threshold, switch 26 moves back to its default position allowing for adaptive gain control of the input signals. Variable attenuator 36 is then reset to minimum attenuation.

It is noted that the functional blocks depicted in FIG. 1 may be embodied in separate discrete devices or in a single integrated circuit without departing from the inventive concepts of the present invention. Additionally, it is noted that the functional blocks depicted in FIG. 1 may be implemented in whole or in part in software as well as in hardware.

The operation of voice enhancer 10 of FIG. 1 will be discussed in connection with the flowchart of FIG. 2 and the representative signals of FIGS. 3A through 3D.

Figure 2:
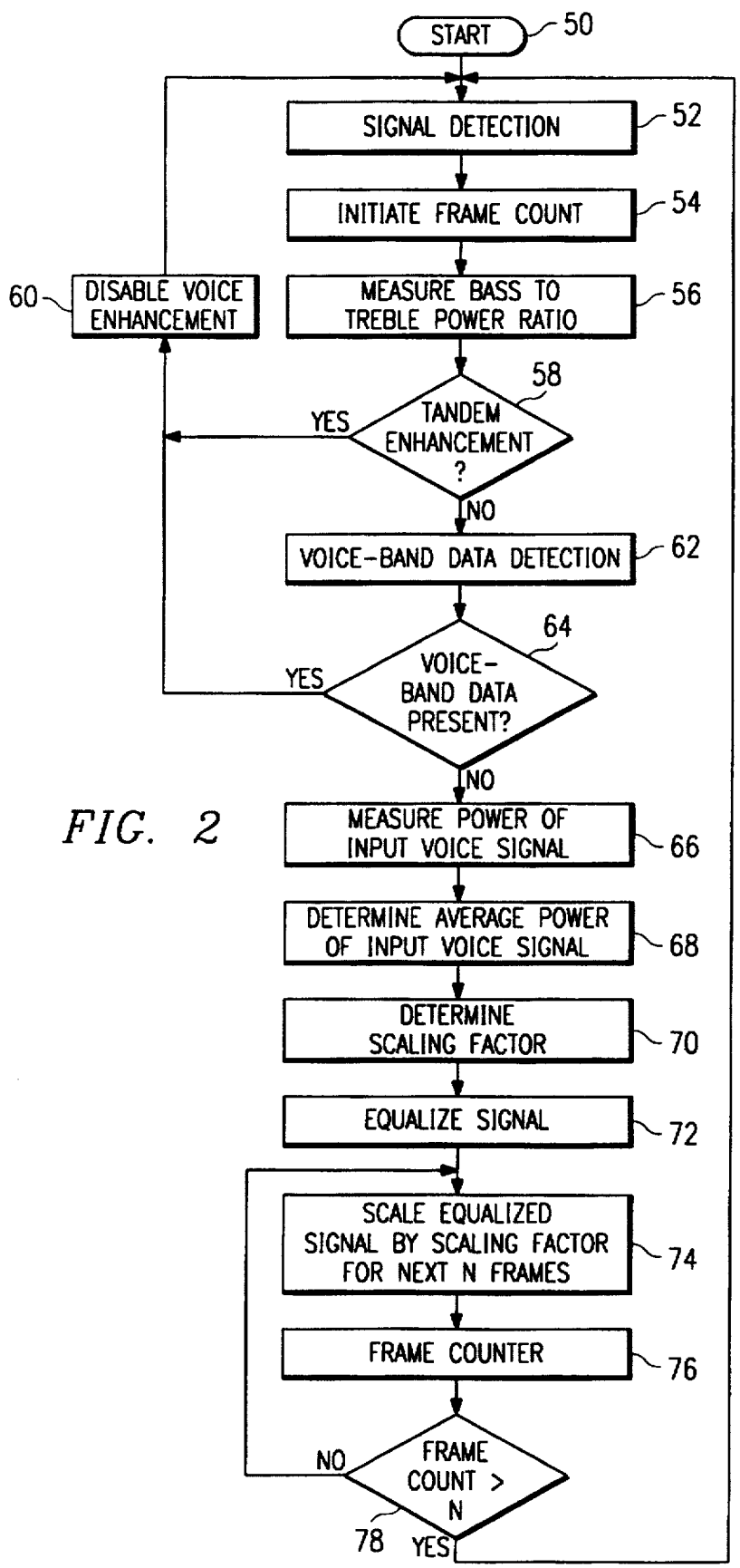
FIG. 2 shows a representative flow chart of the steps executed by the adaptive gain control circuitry for voice enhancement.

FIG. 2 depicts representative steps executed by voice enhancer 10 of the present invention for AGC of an input voice signal. The flow begins at step 50, and at step 52, the present voice enhancement process is initiated when an input signal greater than a predetermined threshold is detected. Below the predetermined threshold, silence is declared to exist on input 12, and switch 26 of voice enhancer 10 is placed in enhancement disable position 34. An example for the predetermined threshold is −40 dBmO, but it can also be adaptively changed based on quiescent noise levels in the network or on the power level of the input voice signal. When silence is detected and switch 26 is placed in enhancement disable position 34, the input signal is provided to output 14 without scaling. This provides the technical advantage of preventing the amplification of network background noise during periods of silence. Any of the blocks associated with the input side of voice enhancer 10 (bass band equalizer 16, power averager 18, bass to treble power comparator 20, or voice-band data detector 22) can be used for detection of silence and an input voice signal.

Upon the detection of an input signal, a frame count is initiated at step 54. A frame system is used by voice enhancer 10 to divide up the transmission of signals into periods of time. A typical frame period used in voice enhancer 10 correspond to 3 milliseconds.

Once an input voice signal has been detected at input 12, then at step 56 voice enhancer 10 determines whether the input signal has been previously enhanced. As described in conjunction with FIG. 1 above, for an average speech signal, the bass to treble power ratio is roughly within a predetermined range. At step 56, bass to treble power comparator 20 measures the bass to treble power ratio to determine whether it is consistent with a previously enhanced signal indicating that a tandem configuration exists. At step 58 a decision is made as to whether the tandem enhancement is present. If a tandem enhancement is present, then the flow proceeds to step 60 where AGC voice enhancement is disabled by AGC enhancement disable 24 by sending an appropriate signal to switch 26 or its equivalent so that switch 26 will be moved to its enhancement disable position 34 (See FIG. 1). Since switch 26 is preset at a default position enabling voice enhancement, then if a tandem configuration is not detected at step 58, the flow proceeds to step 62.

At step 62 the presence of voice-band data is detected. Voice-band data detector 22 implements well-known voice-band data detection methods which need not be discussed in detail. At step 64 a query is made as to whether voice-band data is present in the input signal. If voice-band data detector 22 senses the transmission of voice-band data at input 12, then at step 64 it sends an appropriate signal to AGC enhancement disable 24, which causes switch 26 or its equivalent to move to enhancement disable position 34 at step 60. If voice-band data is not present at step 64, then the flow proceeds to step 66.

It is noted that a detection of a tandem configuration by measuring the bass to treble power ratio at step 56, and the detection of the transmission of voice-band data at step 62, can occur either simultaneously or in reverse order to that depicted in FIG. 2. It is also noted that the default position of switch 26 or its equivalent is to enable voice signal enhancement within the inventive concepts of the present invention. Upon detection of a previously enhanced signal or voice-band data, voice enhancement circuitry 10 will be disabled at switch 26.

At step 66, power averager 18 measures the power of the input signal, and at step 68, the power averager 18 determines the average power of the input signal. At step 70, power averager 18 sends a signal representative of the measured averaged power to gain/attenuation look-up table 28. At step 70, gain/attenuation look-up table 28 provides a gain/attenuation factor or scaling factor based on the measured average input power. The scaling factor is related to the measured average power as previously described, wherein an input signal with a high average power corresponds to a low or attenuating scaling factor, and a low level input signal corresponds to an amplifying scaling factor. At step 72, bass band equalizer 16 equalizes the input voice signal.

Figure 3A:
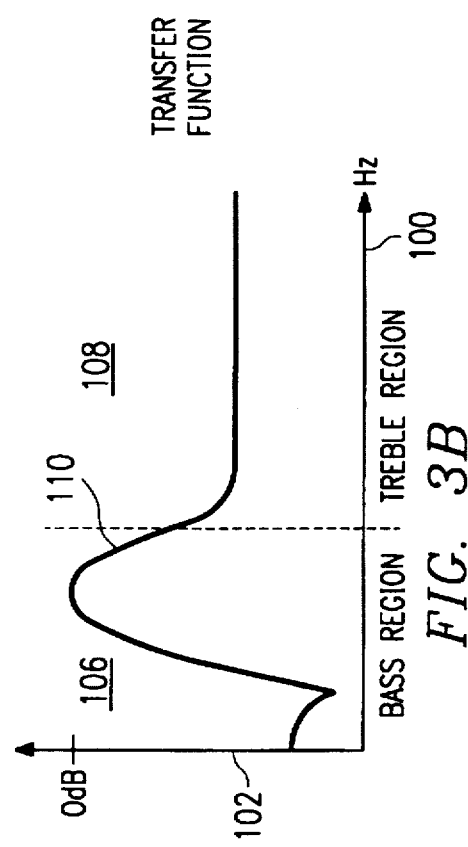
FIGS. 3A through 3D illustrate representative voice signals at different stages of the adaptive gain control process of the present invention.

FIG. 3A shows an example of a representative input voice signal. X-axis 100 is the frequency of the input signal, and Y axis 102 is the amplitude of the input signal in decibels (dB). Input signal 104 has associated with it a bass region 106 and treble region 108. Typically the demarcation between bass region 106 and treble region 108 is viewed as being 300 Hz on line 109, although other demarcation lines may be suitable. Bass region 106 of input signal 104 has been attenuated relative to treble region 108 by either or both an input telephone set and the channel bank of a central office.

Figure 3B:
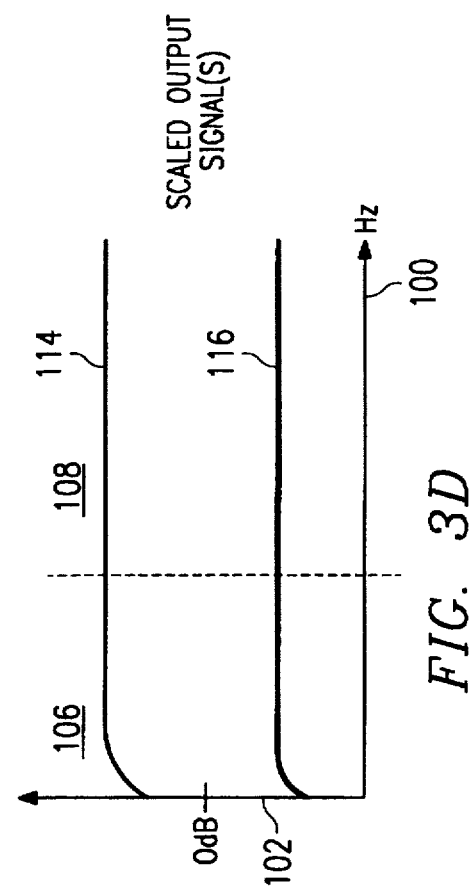

FIG. 3B illustrates transfer function 110 applied by bass band equalizer 16 in step 72 to equalize input signal 104. It is noted that transfer signal 110 decreases the amplitude of treble portion 108 of the input signal relative to bass region 106 of input signal 104.

Figure 3C:
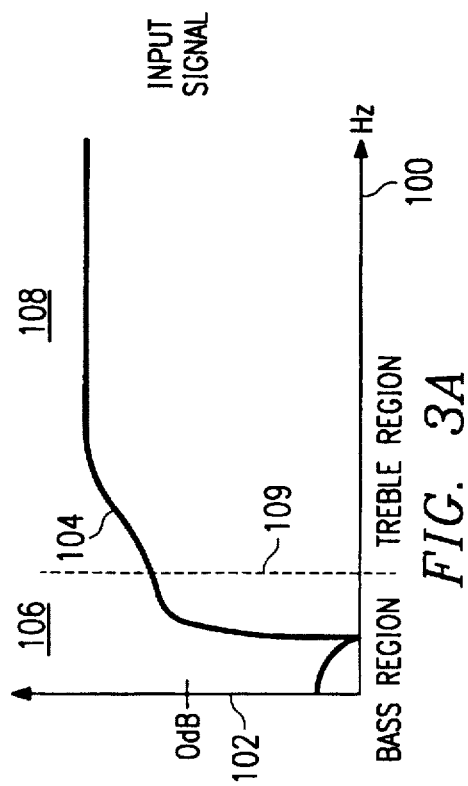

FIG. 3C depicts equalized signal 113 that is signal 104 following equalization at step 72 in bass band equalizer 16. Following equalization in bass band equalizer 16 by transfer function 110, equalized signal 113 has a relatively flat amplitude over the entire frequency range of the signal. It is noted that the determination of the scaling factor at step 70 and the equalization of the input signal at step 72 can occur simultaneously or in the reverse order to that depicted in FIG. 2. The flow then proceeds to step 74 where scaling of the equalized signal 113 occurs. Output scaler 30 applies the scaling factor to equalized signal 113.

Figure 3D:
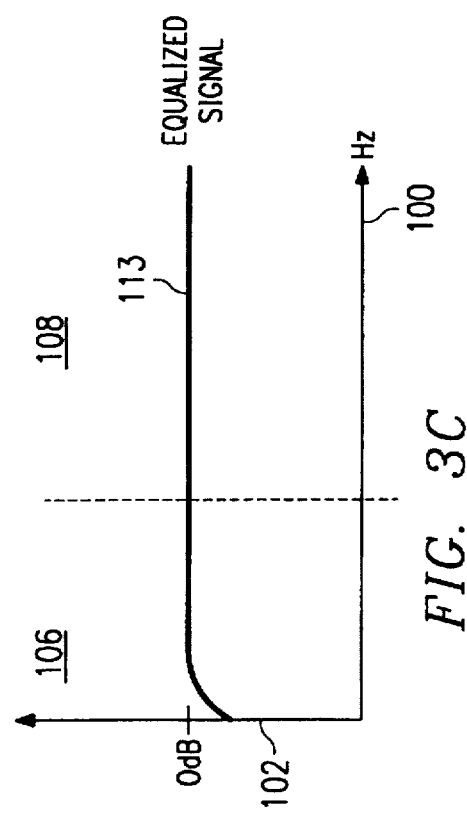

FIG. 3D illustrates two representative scaled output signals, wherein signal 114 shows equalized signal 113 following a positive or amplifying scaling factor, and signal 116 represents equalized signal 113 following a negative or attenuating scaling factor. Following the application of the scaling factor to the input signal, the process proceeds to frame counter step 76. To avoid changing scaling factors too quickly, the scaling factor is adjusted every N frames with a maximum change of X dB, wherein for example, N could be 24, which corresponds to 3 milliseconds, and X could be 0.5 dB. Therefore, the frame counter is incremented at step 76, and at step 78 it is determined whether a number of frames have passed that exceed N. If they have not, then the flow returns to step 74 where the same scaling factor previously determined is applied to the input signal until the frame count exceeds N. At step 78, if the number of frames exceeds N, the flow returns to step 52 where the entire process is begun again. This prevents a scaling factor from changing too quickly.

It is noted that the flow of FIG. 2 allows for continuous adaptive gain control (AGC) of the input signal. The scaling factor is redetermined every N frames of signal transmission allowing for changing the gain of the input signal as the input signal changes. It is also noted that methodology described in association with FIGS. 2 and 3A–3D is representative of a possible embodiment of the present invention, and that other embodiments are possible without departing from the inventive concepts of the present invention.

Figure 4:
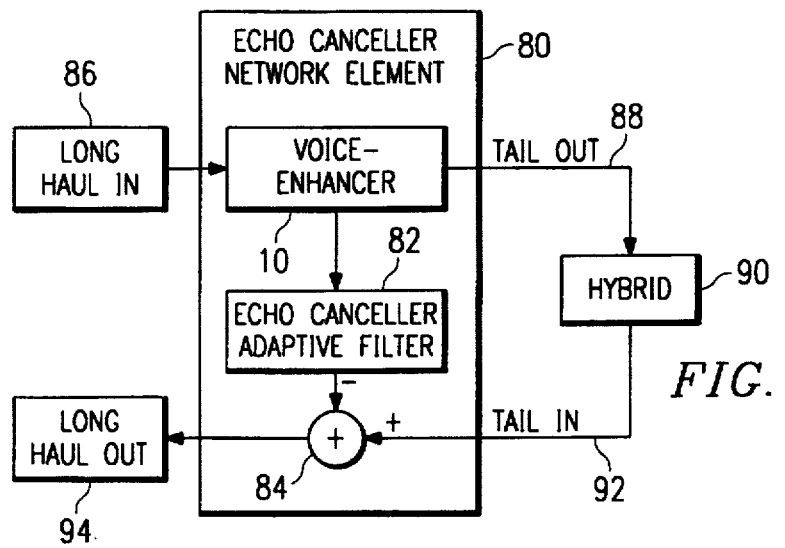
FIG. 4 is a block diagram depicting a possible location of the voice enhancement system of the present invention within a telecommunication network.

FIG. 4 shows a block diagram of an embodiment of voice enhancer 10 in echo canceler network element 80 in a typical telecommunications network. An example of echo canceler network element 80 is EC24 echo canceler manufactured and sold by DSC Communications Corporation. Voice enhancer 10 is shown in echo canceler network element 80 coupled to long haul input 86, which provides the input voice signals being processed in echo canceler network element 80. Voice enhancer 10 performs the necessary AGC scaling of the input voice signal as described in conjunction with FIGS. 1 through 3D above, and provides on tail out 88 the enhanced signals to hybrid 90. Hybrid 90 is coupled by tail in 92 to echo canceler adaptive filter 82 through summing circuitry 84. Summing circuitry 84 provides the output signals to long haul output 94. The operation of echo canceler element 80 to eliminate echoing effects in a two-way transmission line are well known in the art and will not be discussed herein. It is also noted that voice enhancer 10 does not have to be placed in echo canceler network element 80 as other elements within a telecommunications network are suitable locations for voice enhancer 10. It is noted that echo canceler network element 80 including voice enhancer 10 may be located in or separately from a telephone switch.

Figure 5:
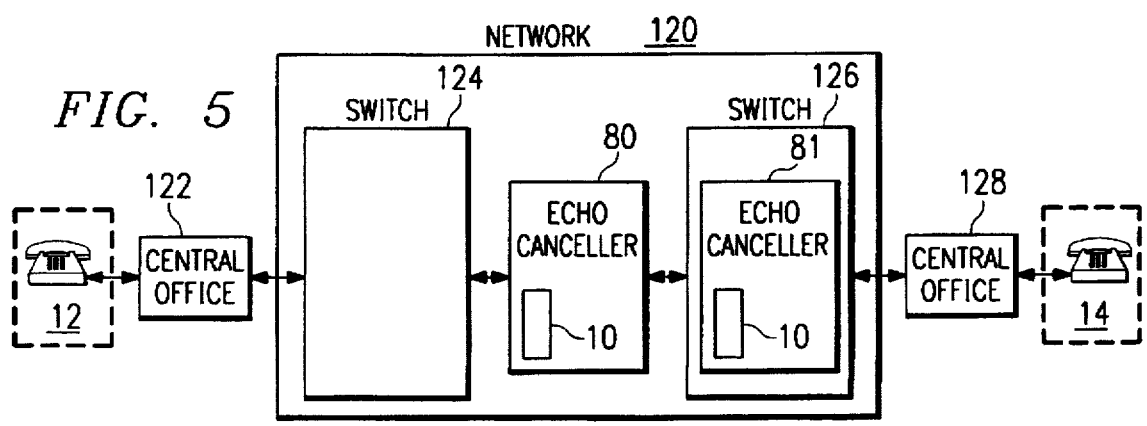
FIG. 5 is a block diagram of a telecommunications network incorporating the adaptive gain control system for voice enhancement of the present invention.

FIG. 5 shows telecommunications network 120 that is an example of a network that may incorporate the AGC voice enhancement system of the present invention to provide an improved voice signal transmission from input 12 to output 14. Network 120 may be a land-line network or wireless network. Input 12 includes an input telephone set that is coupled to central office 122. Central office 122 converts the analog voice signals to digital signals in a channel bank. Central office 122 provides coupling to telephone switch 124. Switch 124 is coupled to echo canceler network element 80 where voice enhancer 10 is included. Echo canceler element 80 is coupled to switch 126 and possibly others. Switch 126 shows an embodiment where echo canceler network element 81, including voice enhancer 10, is located within the switch rather than external to it. Either location of voice enhancer 10 can be employed without departing from its inventive concepts. Switch 126 is coupled to central office 128, which in turn provides coupling to output 14. The functionality of AGC voice enhancer 10 in echo cancelers 80 and 81 of network 120 is as previously described. It is noted that input 12 and output 14 will change roles as the telephone conversation progresses, thereby providing a two-way communication link between input 12 and output 14. It is noted that the embodiment of voice enhancer 10 in echo canceler network elements 80 and 81 is by way of an example of locations for voice enhancer 10 of the present invention.

In operation of voice enhancer 10 of the present invention, an input voice signal is received on input 12. Bass band equalizer 16 equalizes the input signal by attenuating the treble portion of the input signal. This essentially equalizes the signal that has previously had its bass region attenuated by various elements of the network. Power averager 18 measures and determines the average power of the input signal. Gain/attenuation look-up table 28 provides a scaling factor to be applied to the input signal based on the measured average power. Output scaler 30 applies the scaling factor to the equalized signal and supplies the scaled signal to output 14. The scaling factor is continuously updated so that as the level of the input signal changes so does the scaling factor. This provides for adaptively gain controlling the voice signal. The default mode of voice enhancer 10 is to provide voice enhancement to the voice signal.

Voice-band data detector 22 analyzes the input signal to determine whether it includes voice-band data as opposed to a standard voice signal. Bass to treble power comparator 20 measures the power ratio of the bass portion to the treble portion of the input signal to determine if the signal has been previously enhanced in the network. If either previous enhancement or voice-band data is detected, then AGC enhancement disable 24 will cause switch 26 to decouple the enhanced voice signal from output 14.

Therefore, the AGC voice enhancement system of the present invention provides for adaptive gain control by applying a scaling factor to an input voice signal and amplifying/attenuating the input voice signal to provide a more representative signal of the speaker's voice at the receiving telephone set. The present invention eliminates problems associated with prior fixed gain voice enhancement systems by continually and adaptively monitoring the input signal and appropriately scaling the input signal. Changes in the input signal are responded to so that when the input signal is received at the output receiving telephone set, a truer representation of the input voice signal is obtained.

FIG. 6 illustrates a block diagram for an alternate embodiment of the present inventive system and method for providing voice signal enhancement. Voice enhancer 130 of FIG. 6 is very similar to voice enhancer 10 of FIG. 1 and operates in a similar manner to voice enhancer 10 as was described in discussions relating to FIGS. 1–5. Voice enhancer 130 is coupled to input 12 and output 14. Voice enhancer 130 includes signal processor 131 coupled between input 12 and output 14. Signal processor 131 operates on a voice signal received at input 10 to provide appropriate compensation to the voice signal for the effects of attenuation of the voice signal at the input telephone station set or during digitization in the channel bank. Signal processor 131 provides an enhanced voice signal in a two-step process. First, it eliminates the effects of attenuation at input 12 by equalizing and scaling the signal. Secondly, it provides appropriate gain or attenuation to the scaled signal so that not only are the effects of attenuation removed from the voice signal, but the voice signal is at a comfortable level for the listener.

Signal processor 131 includes equalizer 132 coupled to input 12. Equalizer 132 is also coupled to output scaler 134, which in turn is coupled to automatic gain enhancer (AGE) 136. Equalizer 132, output scaler 134, and AGE 136 form a path between input 12 and output 14 and also perform the signal processing necessary for enhancing a voice signal. Equalizer 132 is similar to bass band equalizer 16 in voice enhancer 10 and equalizes an input voice signal by attenuating the amplitude of the treble portion of the input signal. Equalizer 132 may be embodied in a digital filter that decreases the amplitude of the treble portion of an input signal. Equalizer 132 essentially equalizes the bass band distortion of the input signal introduced by an input telephone set or from analog-to-digital conversion of the signal in the channel bank of a central office.

Output scaler 134 couples to equalizer 132 and receives the equalized signal from equalizer 132. Output scaler 134 provides gain to the entire equalized signal it receives from equalizer 132. In one embodiment of output scaler 134, it provides a predetermined, fixed amount of gain to the equalized signal on the order of, for example, 9 dB. In an alternate embodiment, output scaler 134 provides an appropriate gain function using gain/attenuation look-up table 137. Based on the average power of the voice signal received from input 12 as determined by power averager 18, look-up table 137 provides a control signal to output scaler 134. This method allows the gain or attenuation provided by scaler 134 to the voice signal to be dynamically determined. In this way, output scaler 134 provides gain to the entire equalized signal received from equalizer 132 that results in a signal that essentially has the attenuation caused by the input telephone set or central office corrected. The resulting voice signal having been equalized and scaled results in a more natural sounding voice signal.

The output scaled voice signal from output scaler 134 is then provided to AGE 136 for further processing. AGE 136 provides important signal processing to the output scaled signal so that the signal provided at output 14 is comfortable to a listener. AGE 136 provides an appropriate amount of gain or attenuation to the signal it receives from scaler 134. Using the measured average power as determined by power averager 18 and gain/attenuation look-up table 137, AGE 136 provides appropriate automatic gain enhancement to the scaled signal from output scaler 134. AGE 136 and table 137 are configured such that periods of silence from input 12 are not gained, that low-level signals receive appropriate gain, that average level signals receive no gain, and that "hot" or high-level signals are appropriately attenuated. By this way, signal processor 131 provides an enhanced voice signal that may be perceived by the listener as more natural or a truer representation of the speaker's voice at a comfortable listening level.

As previously noted, voice enhancer 130 also includes power averager 18, voice-band data detector 22, and gain/attenuation look-up table 28 similar to voice enhancer 10 of FIG. 1. As previous described, power averager 18 of voice enhancer 130 measures the average power of an input signal. Based on this average power measurement, power averager 18 provided a control signal to equalizer 132, output scaler 134, and AGE 136 so that an input signal is properly processed by signal processor 131. The average power measurements from power averager 18 are also provided to gain/attenuation look-up table 28 so that they may be used by AGE 136 in providing an appropriate gain or attenuation to the output scaled signal from output scaler 134.

An important feature of power averager 18 is that if it detects a signal below a predetermined threshold, e.g., −30 dBmO, it will provide a control signal such that equalizer 132, output scaler 134, and AGE 136 provide substantially a transparent path through signal processor 131 between input 12 and output 14 so that essentially no signal processing occurs. This is important when, for example, silence is present at input 12. Power averager 18 detects the silence and ensures that the background channel noises of the network are not amplified within signal processor 131. Additionally, signal processor 131 may also be set up to provide the function of variable attenuator 36 in FIG. 1 when silence is detected on input 12. This allows the background noises of the network to be suppressed during periods of silence.

Voice-band data detector 22 is also included in voice enhancer 130 in FIG. 6. Voice-band data detector 22 executes well known voice-band data detection techniques to determine whether the signal received from input 12 contains voice-band data. If detector 22 detects the presence of voice-band data in the signal received from input 12, it generates a control signal received by the elements in signal processor 131 such that signal processor 131 forms essentially a transparent path between input 12 and output 14. This essentially prevents any signal processing when data is present in the voice band.

FIG. 7 shows the deployment of voice enhancer 130 in network 138 in two different locations represented by reference numbers 130 and 130'. Network 138 in FIG. 7 is similar to network 120 in FIG. 5, but includes voice enhancers 130 and 130' coupled in series between input 12 and output 14. Input 12 includes an input telephone set that is coupled to central office 122. Central office 122 converts the analog voice signals to digital signals in a channel bank. Central office 122 provides coupling to network 138, which may include several telephone switches similar to switches 124 and 126 in network 120 of FIG. 5 but not explicitly shown in FIG. 7. The switches are, in turn, typically coupled to or include echo canceler elements like element 80 of FIG. 5 (not explicitly shown in FIG. 7) where voice enhancer 130 or 130 may be included. While voice enhancers 130 and 130' are not shown in connection with echo cancelers or switches in network 138 of FIG. 7, it should be understood that voice enhancers 130 and 130' may be positioned in several locations within network 138.

Figure 8:
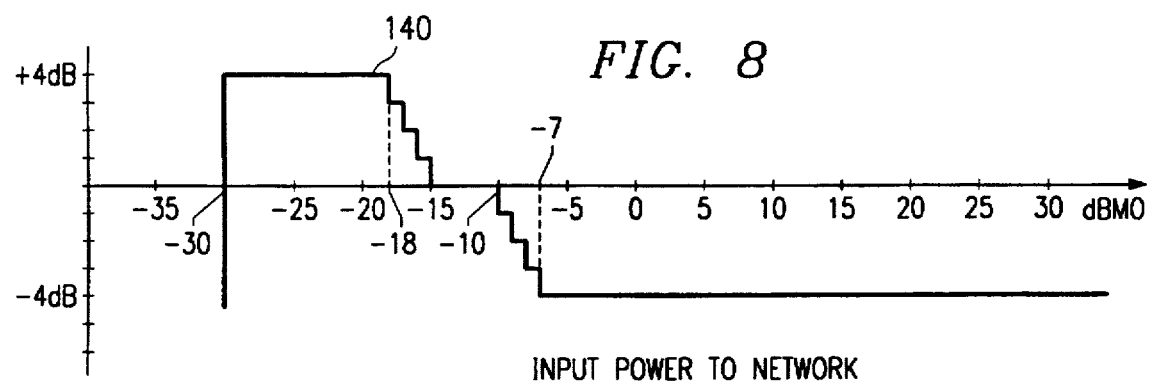
FIG. 8 represents an example of the automatic gain enhancement function in accordance with the voice enhancement system of FIG. 6.

FIG. 8 shows additional detail on gain/attenuation look-up table 137 of voice enhancer 130 of FIG. 6. As previously described, gain/attenuation look-up table 137 provides inputs to AGE 136 for processing the output scaled signal from output scaler 134. Using the information stored in gain/attenuation look-up table 137, AGE 136 will appropriately gain a low-level signal or attenuate a high-level signal so that the signal provided to output 14 is at an acceptable power level. It is important to note the AGE 136 provides gain or attenuation to the entire output scaled signal. FIG. 8 represents the information contained in look-up table 137 in graphical form. The input power to the network of the signal in dsmO is represented on the X-axis, while the gain or attenuation provided by AGE 136 is shown on the Y-axis. Curve 140 represents the relationship between those variables in gain/attenuation look-up table 137.

As previously described, look-up table 137 receives the average power of the input signal from power averager 18. For signals having an average power below a minimum predetermined level, look-up table 137 presumes that there is silence on the line and no gain or attenuation is provided to the signal. In the example provided by FIG. 8, signals having an average input power below −30 dBmO are presumed to be silence and no processing of the signal by AGE 136 is required. This ensures that background noises within the network are not needlessly or harmfully amplified. For signals having an average power above the minimum predetermined level, these signals require gain in order to bring them up to acceptable listening levels.

As previously described, look-up table 137 and AGE 136 provides gain to such low-level signals. In the example shown in FIG. 8, the gain for signals having an average power between −30 dBmO and −18 dBmO is +4 dB as represented by curve 140. Therefore, signals having an average power in this range will receive a predetermined amount of gain on the order of 4 dB. It is noted that the gain function may be varied as desired. Continuing the example of curve 140 for AGE 136 in FIG. 8, input signals having an average power above −18 dBmO through −15 dBmO will receive gain in accordance with the step function represented by FIG. 8 between these two values. This corresponds to decreasing the amount of gain provided to these signals as the average power level of a signal increases.

Continuing the example of FIG. 8, for signals having an average input power between −15 dBmO and −10 dBmO, look-up table 137 and AGE 136 provide no gain to such a signal. These signals are at an acceptable level once processed by equalizer 132 and output scaler 134 so that no additional processing is required by AGE 136. Once the input power of the signal exceeds −10 dBmO, then a step function for introducing attenuation to the received signal may be implemented as shown. Therefore, as a signal increases from −10 dBmO to −7 dBmO, the signal will begin to be attenuated by AGE 136 in accordance with the step function shown for curve 140 in FIG. 8. Once that signal reaches −7 dBmO, then a predetermined amount of attenuation, represented by −4 dB in FIG. 8 will be introduced by a look-up table 137 and AGE 136. By this method, voice enhancer 130 of the present invention will not only eliminate the effects of bass attenuation in a voice signal from network elements, but will also gain low level signals and attenuate high level signals to produce a signal that is more amenable to a listener at output 14. It is noted that the values and shape for curve 140 in FIG. 8 are provided by way of an example only and are not intended to limit the spirit and scope of the present invention. It will be appreciated by those skilled in the art that curve 140 may have different thresholds and values without deviating from the concepts of the present invention.

Figure 9A:
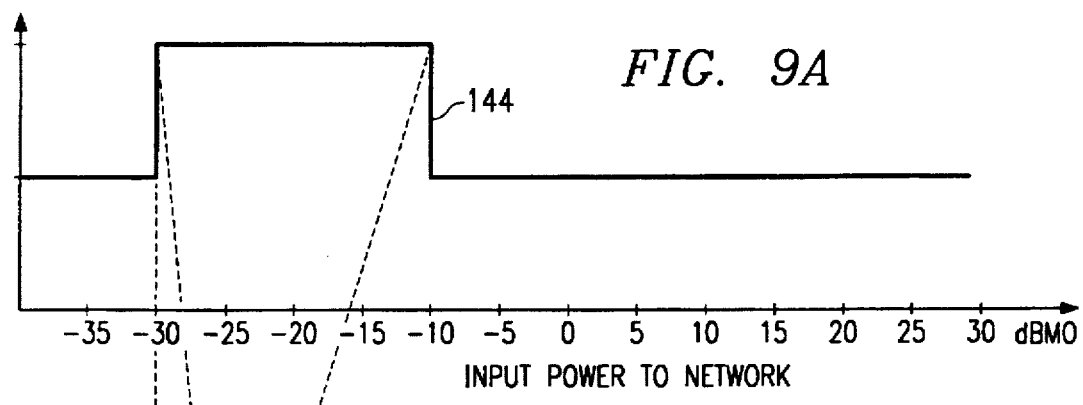
FIGS. 9A and 9B represent a possible operational scenario for the tandemed voice enhancers of FIG. 7.
Figure 9B:
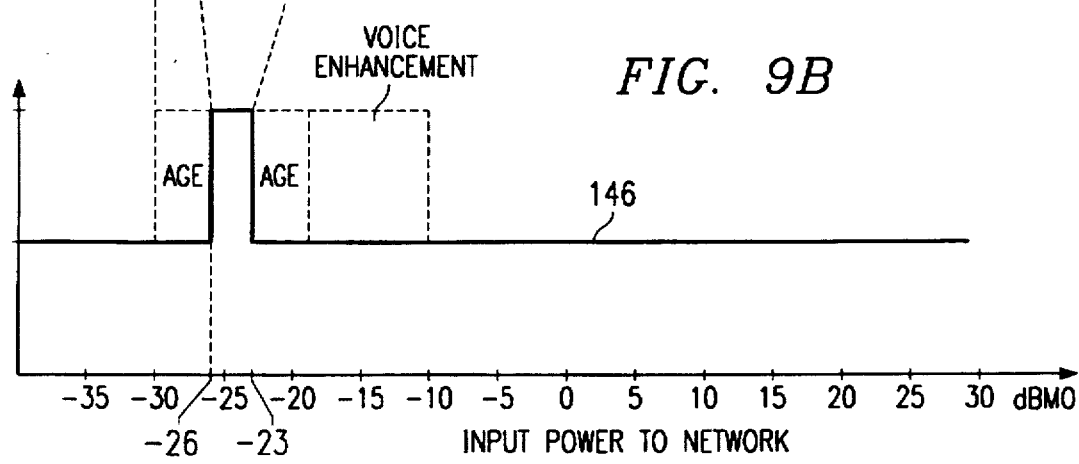

Proceeding to FIGS. 9A and 9B, these FIGUREs, taken in connection with FIG. 8, illustrate how the present invention may be used for tandem detection purposes. In other words, to detect when a voice signal has been previously enhanced and to process the signal appropriately. As previously described, one of the problems faced with providing enhanced voice signals is that a given voice signal may pass through more than one network element that may attempt to introduce gain to that signal. Therefore, the present invention provides a novel technique for recognizing when a voice signal has been previously enhanced and prevents the signal from being "damaged" through subsequent enhancements. Voice enhancer 130 essentially accomplishes this by continuously measuring the average power of the input signal from input 12 and appropriately setting the signal processing by equalizer 132 and output scaler 134 and the gain provided by AGE 136. Using the tandem algorithm just described, a voice signal does not receive inappropriate gain that may result in a signal that is unusable in the network.

Curve 144 in FIG. 9A represents the functioning of equalizer 132 and output scaler 134 in a first voice enhancer 130, while curve 146 represents the functioning of equalizer 132 and output scaler 134 in a second voice enhancer 130 coupled in tandem with a first voice enhancer. This situation is illustrated, for example, in FIG. 7 with voice enhancer 130 shown coupled with voice enhancer 130' within network 138. Equalizer 132 and output scaler 134 within signal processor 136 of each voice enhancer are programmed to turn on and off based on the input power of the signal received. The on and off status of voice enhancer 130 is represented by curve 144 in FIG. 9A, while the on and off status of voice enhancer 130' is represented by curve 146 in FIG. 9B.

As previously described, power averager 18 measures power of the input signal and provides a control signal to equalizer 132 and output scaler 134. As previously described for the operation of AGE 136 of voice enhancer 130, silence on the input signal must be detected and appropriately handled. Accordingly, curve 144 and curve 146 in FIGS. 9A and 9B show that equalizer 132 and output scaler 134 are off when the power of the input signal is below a minimum predetermined level, illustratively −30 dBmO. Once the power of input signal to the first voice enhancer 130 exceeds the minimum predetermined level, then equalizer 132 and output scaler 134 will process the signal so as to eliminate the effects of attenuation in the bass portion of the signal. For example, this processing of the input signal may result in the addition of about 9 dB of gain to the bass portion of the signal. This is accomplished in a novel way by first attenuating the treble portion of the signal and then providing gain to the entire signal. This method is more fully described above, particularly with respect to discussions relating to FIGS. 3A–3D.

Equalizer 132 and output scaler 134 of signal processor 136 in first voice enhancer 130 will provide this processing to the input signal so long as the power of the input signal is below a maximum predetermined level, illustratively −10 dBmO in FIG. 9A. Once the power level of the input signal goes above −10 dBmO, then gain to the bass portion of the signal is no longer required and equalizer 132 and output scaler 134 functions of signal processor 136 are no longer required and these functions are turned back off. It is noted that as shown in FIG. 8, for signals having an input power greater than the maximum predetermined level, −10 dBmO, that these signals are in fact attenuated by AGE 136. This ensures that high level or "hot" signals receive appropriate signal processing in accordance with the present invention.

Proceeding to FIG. 9B, curve 146 represents the functioning of equalizer 132 and output scaler 134 in second voice enhancer 130. Curve 146 assumes that voice enhancer 130 is coupled in series with another voice enhancer 130, providing voice enhancement to an input signal. This may be represented by the coupling of voice enhancer 130 and 130' in FIG. 7. As an input signal is received at telephone set 12, processed by central office 122, and provided to voice enhancer 130, voice enhancer 130 provides signal processing with signal processor 131 as previously described. Depending on the input signal's power, it can result in both the equalization and output scaling of the signal as well as gain to the entire signal by AGE 136. Assuming that this is the case and the input signal requires both types of signal processing, then the signal leaving voice enhancer 130 will have, at a minimum, 4 dB of gain provided to it. This means that when the signal is received at second voice enhancer 130', that it will receive a signal having already been gained. This causes a shift in curve 146 of FIG. 9B from the predetermined minimum level for activating equalizer 132 is and output scaler 134, from illustratively, −30 dBmO to −26 dBmO. On the other end of curve 146, because of the differentiation between AGE 136 and equalizer 132 and output scaler 134 the second voice enhancer will turn off at approximately −23 dBmO, because gain will have already been provided by AGE 136 and equalizer 132 and output scaler 134 in voice enhancer 130. But note, because AGE 136 is separate from output scaler 134, if a signal has been previously enhanced, AGE 136 can provide attenuation to that signal so that it is not overly gained by the output scaler. This ensures that tandem detection is accomplished and that the signal does not saturate and does not become unusable.

By this way, a voice signal may be enhanced with the present invention and the problems associated with passing a voice signal through several network elements that may provide signal enhancement are avoided.

Although the present invention has been described in detail, it should be understood that various changes, substitutions and alterations can be made hereto without departing from the spirit and scope of the invention as defined by the appended claims.

What is claimed is:

1. A method for providing voice enhancement in a telecommunications network comprising the steps of:

determining an average power of an input voice-band signal;

generating a control signal in response to the average power of the input voice-band signal;

determining an automatic gain factor in response to the average power of the input voice-band signal;

equalizing the input voice-band signal by attenuating a predetermined portion of the input voice-band signal in response to the control signal;

scaling the equalized voice-band signal with a scaling factor in response to the control signal; and applying the automatic gain factor to the scaled voice-band signal in response to the control signal.

2. The method of claim 1 further comprising the steps of:

detecting voice-band data in the input voice-band signal and responding to the detection of voice-band data in the input signal by:

suspending the equalization of the input voice-band signal, and setting the scaling factor and automatic gain factor to provide no change to the input voice-band signal.

3. The method of claim 1 wherein the applying the automatic gain factor step further comprises:

providing gain to voice-band signals having an average power above a predetermined minimum average power level but below a first predetermined power level;

providing no change to voice-band signals having an average power above the first predetermined power level and below a second predetermined power level, and wherein the second predetermined power level is greater than the first predetermined power level, and attenuating voice-band signals having an average power level above the second predetermined power level.

4. The method of claim 1 wherein the determining the average power, determining an automatic gain factor, equalizing, scaling, and applying steps are performed in an echo canceler of a telecommunications network.

5. The method of claim 1 wherein the predetermined portion of the input voice-band signal is above substantially 300 Hz.

6. The method of claim 1 wherein the applying the automatic gain factor step further comprises using the previously determined automatic gain factor for a predetermined period of time.

7. The method of claim 1 wherein the determining an automatic gain factor step further comprises the step of limiting the amount of change between consecutive automatic gain factors.

8. The method of claim 1 further comprising the steps of:
  detecting periods of silence in the input voice-band signal, and responding to the detection of silence in the input voice-band signal by;
    suspending the equalization of the input voice-band signal, and
    setting the scaling factor and automatic gain factor to provide no change to the input voice-band signal.

9. The method of claim 8 further comprising the step of attenuating the input voice-band signal so that the noise level of the periods of silence is minimized.

10. A method for providing enhancement to a voice-band signal in a telecommunications network, comprising the steps of:
  determining an average power of an input voice-band signal;
  determining an automatic gain factor in response to the average power of the input voice-band signal;
  generating a control signal in response to the average power of the input voice-band signal;
  equalizing the input voice-band signal by attenuating a predetermined portion of the input voice-band signal in response to the control signal;
  scaling the equalized voice-band signal with a scaling factor in response to the control signal; and
  applying the automatic gain factor to the scaled voice-band signal in response to the control signal by;
    providing gain to voice-band signals having an average power above a predetermined minimum average power level but below a first predetermined power level,
    providing no change to voice-band signals having an average power above the first predetermined power level and below a second predetermined power level, and wherein the second predetermined power level is greater than the first predetermined power level, and
    attenuating voice-band signals having an average power level above the second predetermined power level.

11. The method of claim 10 wherein the determining the average power, determining an automatic gain factor, equalizing, scaling, and applying steps are performed in an echo canceler of a telecommunications network.

12. The method of claim 10 wherein the predetermined portion of the input voice-band signal is above substantially 300 Hz.

13. The method of claim 10 wherein the applying the automatic gain factor step further comprises using the previously determined automatic gain factor for a predetermined period of time.

14. The method of claim 10 further comprising the steps of:
  detecting voice-band data in the input voice-band signal and responding to the detection of voice-band data in the input signal by;
    suspending the equalization of the input voice-band signal, and
    setting the scaling factor and automatic gain factor to provide no change to the input voice-band signal.

15. The method of claim 10 further comprising the steps of:
  detecting periods of silence in the input voice-band signal and responding to the detection of silence in the input voice-band signal by;
    suspending the equalization of the input voice-band signal, and
    setting the scaling factor and automatic gain factor to provide no change to the input voice-band signal.

16. A system for providing enhancement to a voice-band signal in a telecommunications network comprising:
  a power averager for determining an average power of the voice-band signal, the power averager generating a control signal in response to the average power of the voice-band signal;
  an equalizer for attenuating a predetermined portion of the voice-band signal in response to the control signal;
  an output scaler for scaling the equalized voice-band signal with a scaling factor in response to the control signal; and
  an automatic gain enhancer for applying an automatic gain factor to the scaled voice-band signal in response to the control signal, and wherein the automatic gain factor is dependent upon the average power of the voice-band signal.

17. The system of claim 16 further comprising a voice-band data detector for detecting voice-band data in the voice-band signal and for preventing the equalizer, output scaler, and the automatic gain enhancer from changing the voice-band signal.

18. The system of claim 16 wherein the automatic gain enhancer further provides:
  gain to voice-band signals having an average power above a predetermined minimum average power level but below a first predetermined power level;
  no gain or attenuation to voice-band signals having an average power above the first predetermined power level and below a second predetermined power level, and wherein the second predetermined power level is greater than the first predetermined power level; and
  attenuates voice-band signals having an average power level above the second predetermined power level.

19. The system of claim 16 further comprising a voice-band data detector for detecting voice-band data in the voice-band signal and wherein the voice-band data detector is operable to prevent the equalizer, output scaler, and the automatic gain enhancer from changing the voice-band signal.

20. The system of claim 16 wherein said power averager, equalizer, output scaler, and automatic gain enhancer are located in an echo canceler of telecommunications network.

21. The system of claim 16 wherein the predetermined portion of the voice-band signal attenuated by said equalizer is above substantially 300 Hz.

22. The system of claim 16 further comprising a gain/attenuation look-up table for providing the automatic gain factor to be used by said automatic gain enhancer on the voice-band signal.

* * * * *